(12) United States Patent
Charbonnier et al.

(10) Patent No.: US 6,618,402 B1
(45) Date of Patent: Sep. 9, 2003

(54) DEVICE FOR GENERATING A PLURALITY OF LASER BEAMS

(75) Inventors: Serge Charbonnier, Chambray (FR); Damien Boureau, Rouen (FR)

(73) Assignee: Automa-Tech, Val de Reuil (FR)

( * ) Notice: Subject to any disclaimer, the term of this patent is extended or adjusted under 35 U.S.C. 154(b) by 0 days.

(21) Appl. No.: 09/688,448

(22) Filed: Oct. 16, 2000

(30) Foreign Application Priority Data

Nov. 2, 1999  (FR) ............................................. 99 13656

(51) Int. Cl.$^7$ ................................................. H01S 3/13
(52) U.S. Cl. ........................ 372/29.021; 372/22; 372/98
(58) Field of Search ........................ 372/98, 23, 29.021; 354/4

(56) References Cited

U.S. PATENT DOCUMENTS 4,797,696 A * 1/1989 Allen et al. .................. 396/548
5,933,216 A   8/1999 Dunn

* cited by examiner

*Primary Examiner*—Leon Scott, Jr.
(74) *Attorney, Agent, or Firm*—O'Melveny & Myers LLP

(57) ABSTRACT

The invention relates to a device for generating a plurality of laser beams. The device comprises:

a laser source emitting an initial beam at P wavelengths;
  a wavelength splitter assembly for splitting the initial beam into N intermediate beams where $N \leq P$, each intermediate beam containing a group of wavelengths comprising at least one wavelength; and
  $N'$ energy splitter assemblies where $N' \leq N$ for splitting an intermediate beam into $n_i$ divisional beams, each of the $n_i$ divisional beams having substantially the same energy, whereby K divisional beams are obtained with $$K = N - N' + \sum_{i=1}^{i=N'} n_i.$$

12 Claims, 2 Drawing Sheets

DEVICE FOR GENERATING A PLURALITY OF LASER BEAMS

The present invention relates to a device for generating a plurality of laser beams suitable particularly but not exclusively for use in equipment for applying laser beam treatment to a surface that is sensitive to the impact of a laser beam.

BACKGROUND OF THE INVENTION

In the manufacture of printed circuits, one of the steps consists in covering the conductive layer of the printed circuit in a layer of resist material and in exposing said layer of resist through an artwork to define the shape of the conductor tracks that are to be obtained on the printed circuit. After the resist layer has been exposed, the non-exposed zones are removed, which zones correspond to portions of the conductive layer that are to be removed in turn.

Another technique for making printed circuits is becoming popular in which the resist layer is imprinted locally by the impact of a laser beam. The laser beam impact is usually under the control of scanning equipment that includes a rotary polygonal mirror associated with a shutter device for controlled interruption of the laser beam and usually constituted by an acousto-optical modulator.

Since the number of laser beam impacts required for making a printed circuit panel of large dimensions with precision is naturally itself very large, it is advantageous to be able to subdivide the surface of the printed circuit panel into a plurality of zones and to scan each of the zones simultaneously with a respective laser beam, thereby significantly reducing the length of time required for exposing the entire panel.

However, in order to be able to achieve this result, it is necessary for the energy of each laser beam to lie, in a well-defined range corresponding to the sensitivity of the material constituting the resist layer, so that the laser radiation modifies the state of the resist uniformly at all impact points.

Furthermore, the cost of acousto-optical modulators increases when they are required to control a light beam containing a wide range of wavelengths. Acousto-optical modulators are also adapted to a certain energy range, and if this energy range is exceeded then the operation of the modulator ages more rapidly.

Finally, the efficiency of modulation increases with narrowing wavelength range.

OBJECTS AND SUMMARY OF THE INVENTION

An object of the present invention is to provide a device for generating a plurality of laser beams, each laser beam comprising a limited range of wavelengths, and each laser beam containing energy lying in a relatively limited range.

To achieve this object, the invention provides a device for generating a plurality of laser beams, the device comprising:

a laser source emitting an initial beam at P wavelengths;

a wavelength splitter assembly for splitting the initial beam into N intermediate beams, where $N \leq P$, each intermediate beam containing a group of wavelengths comprising at least one wavelength; and N' energy splitter assemblies, where $N' \leq N$, for splitting an intermediate beam into $n_i$ divisional beams, each of the $n_i$ divisional beams having substantially the same energy, whereby K divisional beams are obtained with $$K = N - N' + \sum_{i=1}^{i=N'} n_i$$

It will be understood that by beginning by splitting the laser beam emitted by the source into a plurality of intermediate beams, beams are obtained at the outlet from the splitter occupying wavelength ranges that are well defined and without overlap. It will also be understood that in the second step which consists in splitting the energy of at least some of the intermediate beams, the divisional beams that are finally obtained occupy well-defined wavelength ranges and have energy that is easy to define.

Preferably, the wavelength splitter assembly comprises:

a device for splitting said initial beam into P unit beams, each unit beam corresponding to one wavelength; and N means for grouping together some of the P unit beams in a given group of wavelengths, the wavelengths of a group being disjoint from the wavelengths of another group, thereby obtaining N intermediate beams.

By means of this step of partially recombining monochromatic laser beams, the monochromatic beams belonging to the same group are re-colinearized. They can be processed, for example, by acousto-optical modulators or more generally by optical systems with substantially the same precision as a monochromatic beam.

Another object of the invention is to provide equipment for treating a surface that is sensitive to a laser beam, in particular for treating the layer of resist formed on the metal layer of a printed circuit in order to obtain the conductor tracks of said printed circuit, or to treat the metal layer directly.

The treatment equipment comprises:

a device for generating K divisional laser beams of the above-defined type;

K acousto-optical modulators, each modulator receiving a divisional beam, each modulator being adapted to the group of wavelengths of the divisional beam it receives and being adapted to its energy; and deflector means for deflecting each modulated laser beam so that each modulated laser beam scans a fraction of said surface.

BRIEF DESCRIPTION OF THE DRAWINGS

Other characteristics and advantages of the invention will appear better on reading the following description of various embodiments of the invention given as non-limiting examples. The description refers to the accompanying figures, in which.

MORE DETAILED DESCRIPTION

Figure 1:
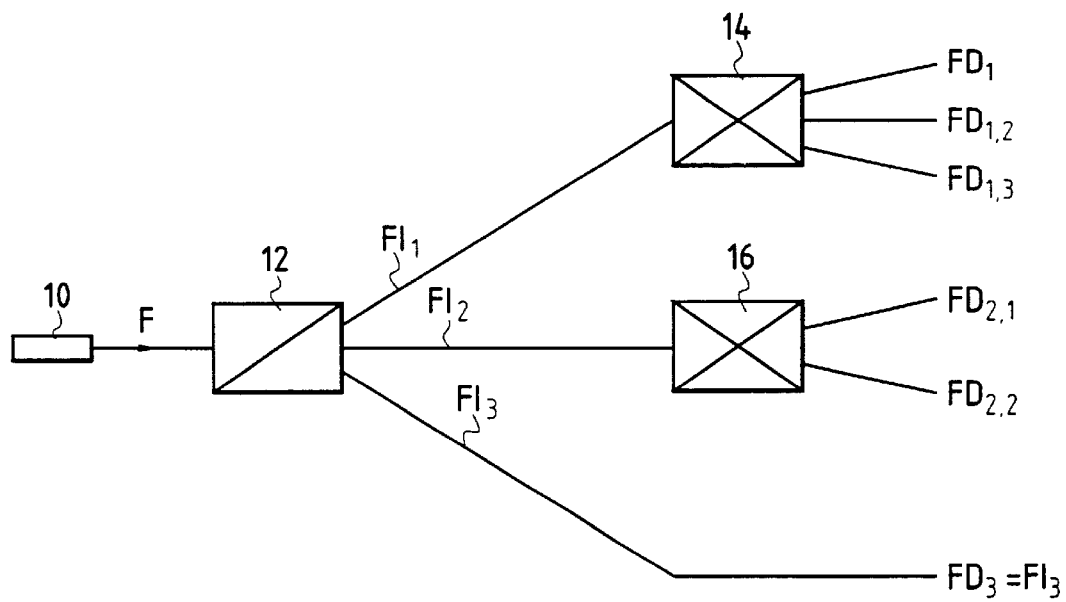
FIG. 1 is a simplified view of the laser beam generator device as a whole.

The laser beam generator device as a whole is described with reference initially to FIG. 1. The device comprises a laser source 10 which emits a beam F. The beam F enters a splitter for splitting the laser beam by wavelength and referenced 12. The splitter 12 delivers intermediate laser beams $FI_1$, $FI_2$, $FI_3$ at its outlet. Naturally, depending on the nature of the initial laser beam F, there may be some other number of intermediate laser beams. Some of the intermediate beams, in the example described of the beams $FI_1$ and $FI_2$, are applied to the inlets of beam splitters that split power, and respectively referenced 14 and 16. In the particular example shown, the splitter 14 delivers three divisional beams $FD_{1,1}$, $FD_{1,2}$, and $FD_{1,3}$. Each of the divisional beams contains one-third of the power contained in the intermediate $FI_1$. At its outlet, the beam splitter 16 delivers two divisional-beams $FD_{2,1}$ and $FD_{2,2}$, each containing half of the power contained in the beam $FI_2$. The beam $FI_3$ is not split and directly constitutes divisional beam $FD_3$.

It will be understood that this device for generating laser beams that are split from a common initial laser beam F makes it possible to obtain output divisional beams containing wavelengths that lie in relatively narrow wavelength ranges as defined by the wavelength splitter 12, and having powers which can all lie in a relatively narrow power range by an appropriate selection of wavelength groups and by splitting the intermediate beams in energy as a function of the power contained in each wavelength of the initial beam.

In a preferred implementation of the invention, the laser source 10 is an ionized argon type laser which in this particular case operates at wavelengths in the range 333.6 nanometers (nm) to 363.8 nm, emitting a power of 7 watts continuously at the above-mentioned wavelengths.

The wavelengths and the powers of the divisional beams are very well matched to the materials that normally constitute a resist layer.

More precisely, the emitted wavelengths and their respective energies are given below.

|  | Wavelength (nm) | Power (W) |
|---|---|---|
| $FI_1$ | 333.6 | 0.75 |
|  | 334.4 | 0.72 |
|  | 335.8 | 0.41 |
| $FI_2$ | 351.1 | 2.10 |
|  | 351.4 | 0.90 |
| $FI_3$ | 363.8 | 2.10 |

Figure 2:
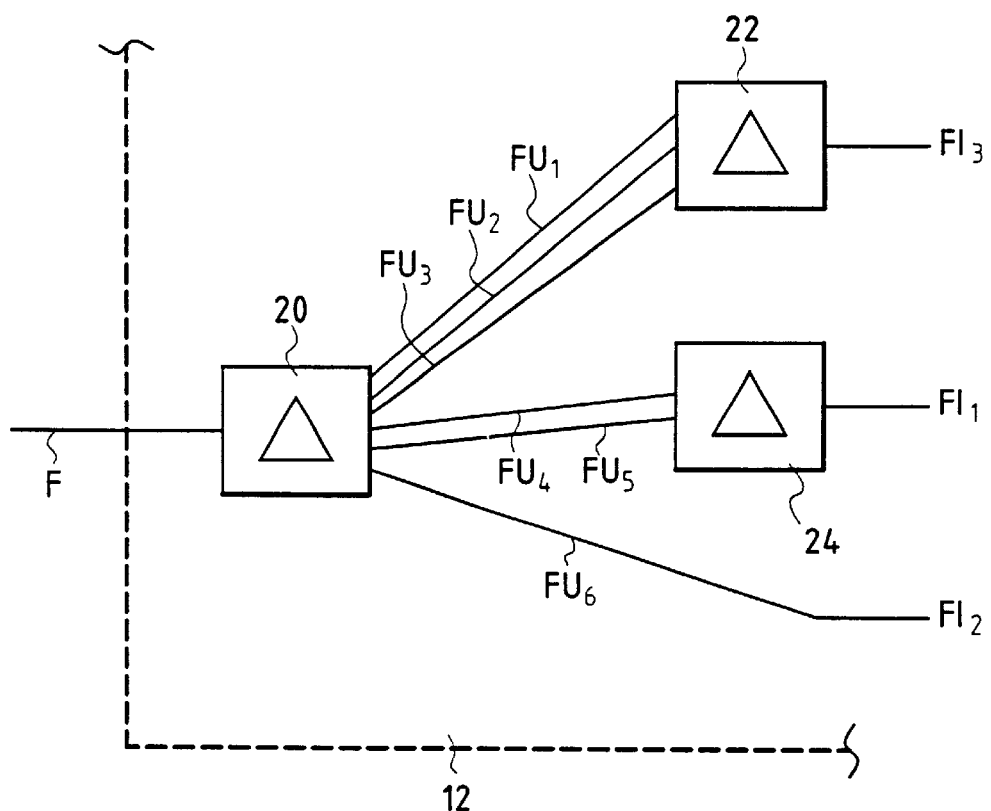
FIG. 2 is a view showing a portion of the FIG. 1 device corresponding to an improved embodiment.

FIG. 2 shows a preferred embodiment of the splitter for splitting the beam in wavelength. This splitter 12 is constituted by a beam splitter proper 20, e.g. constituted by two prisms, which delivers at its outlet as many unit beams FU as the initial beam F contains wavelengths. The unit beams as delivered are grouped together by recombining devices such as 22 and 24 so as to obtain the intermediate beams FI at the outlets thereof, each containing a desired range of wavelengths. In the particular example corresponding to the above-mentioned laser, the first three frequencies corresponding to wavelengths of 333.6 nm, 334.4 nm, and 335.8 nm are grouped together in the recombining device 22. The wavelengths of 351.1 nm and 351.4 nm are recombined in the recombining device 24.

In this particular example, the intermediate beam $FI_1$ contains power of 3 watts, the beam $F_2$ contains power of 2.1 watts, and the beam $FI_3$ contains power of 1.88 watts. In this particular case, the final divisional beams $FD_{,1,1}$ to $FD_3$ have powers lying in the range 1.1 watts to 1.88 watts. This range of power is sufficiently narrow for the intended applications.

Figure 4:
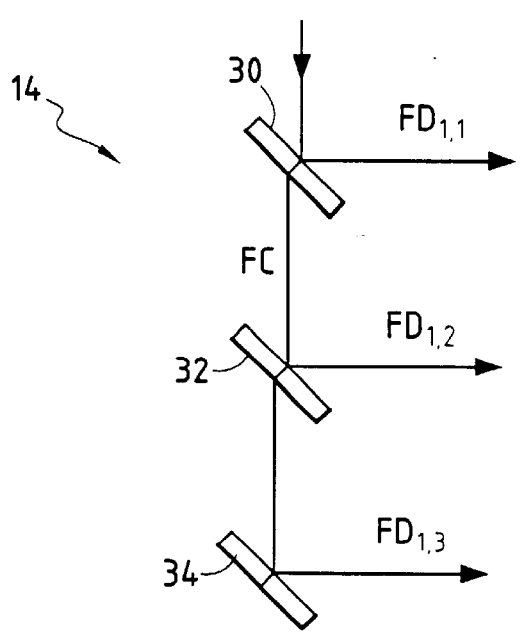
FIG. 4 shows an embodiment of the splitter for splitting the beam in energy.

FIG. 4 shows an embodiment of the energy splitter device 14. In conventional manner, it comprises a first semireflecting plate 30 which receives the beam $FI_1$ and delivers the divisional beam $FD_{1,1}$ containing one-third of the power of the intermediate beam, with the semireflecting plate 30 passing a complementary beam FC that contains 66% of the power. A second semireflecting plate 32 splits the beam FC into a second divisional beam $FD_{1,2}$ and a third divisional beam $FD_{1,3}$, both having the same power. This third divisional beam is reflected parallel to the first two divisional beams by a mirror 34.

Figure 3:
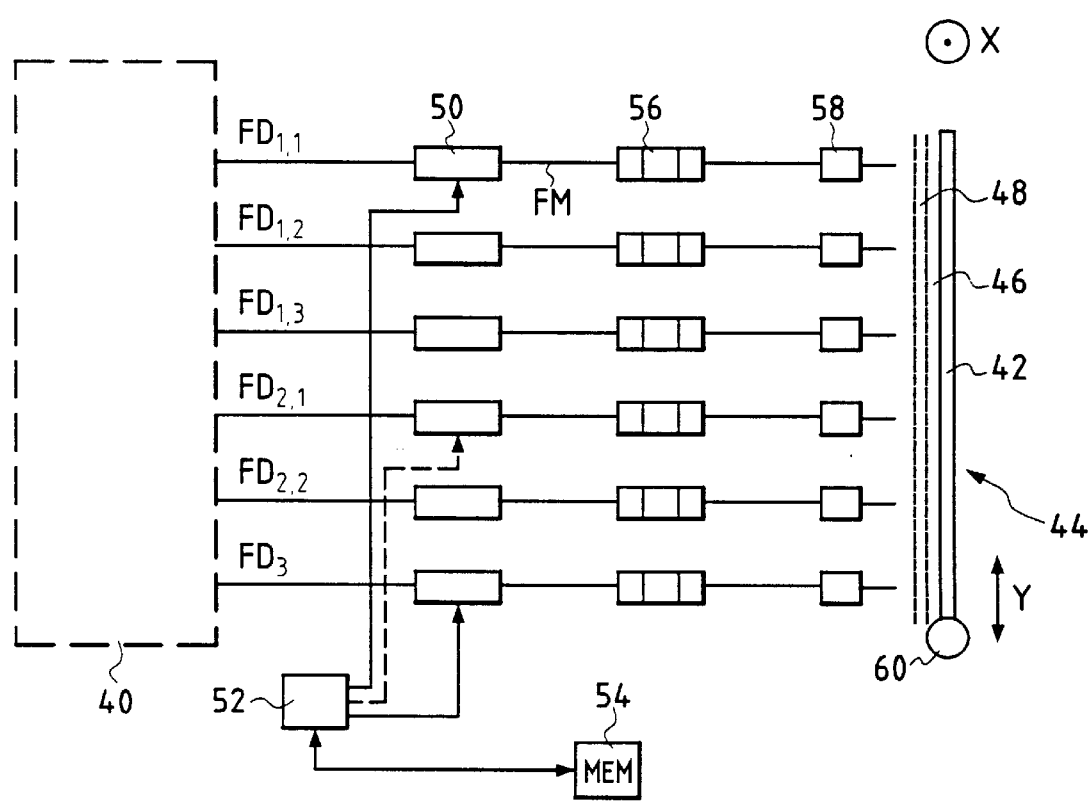
FIG. 3 shows an application of the laser beam generator device to making a printed circuit.

In FIG. 3, there is shown in simplified manner an example of the laser beam generator device applied to performing a step in the manufacture of a printed circuit. In this figure, the splitter circuit of FIG. 1 that delivers the divisional beams $FD_{1,1}$ to $FD_3$ is referenced 40. This figure also shows in simplified manner the insulating backing 42 of the printed circuit 44. In likewise simplified manner, there can be seen the layer of conductive material, e.g. copper 46 covered by the layer of resist 48 whose state is altered by the impact of the laser beams. The equipment for processing the printed circuit in this particular example has six acousto-optical modulators 50 each of which receives a respective one of the divisional beams FD. The acousto-optical modulators 50 are controlled to occupy a transparent state or a non-transparent state by a control unit 52 associated with a memory 54. The modulated beams FM leaving the modulators 50 are directed to rotary polygonal mirrors 56 which enable the resist layer 48 to be scanned in a direction perpendicular to the plane of FIG. 3, referred to herein as the X direction, over a length corresponding to the zone that relates to one laser beam. The light beam deflected by the mirror 56 passes through a focusing system 58, which system also rectifies the light beam so that it propagates in a direction which is orthogonal to the printed circuit. This figure also shows means 60 for moving the panel in the Y direction.

Naturally, the laser beam splitter could be used in installations for manufacturing printed circuit panels in which the laser beam is used for direct ablation of the layer of resist. Indeed, the installation could equally well be of the type in which there is no layer of resist and the laser beam is used to directly ablate the conductive layer, e.g. a copper layer.

What is claimed is:

1. A system for generating a plurality of laser beams that have substantially an equal amount of power, the system comprising:

a laser source, the laser source configured to an initial beam comprising P wavelengths, where P is an integer;

a wavelength splitter assembly positioned to receive the initial beam from the laser source and configured to the initial beam into N intermediate beams, where N is an integer and $N \leq P$, each intermediate beam comprising at least one wavelength; and N' energy splitter assemblies, where N' is an integer and $N' \leq N$, each energy splitter assembly positioned to receive one of the intermediate beams and configured to split one of the intermediate beams into $n_i$ divisional beams, where $n_i$ is an integer, each of the $n_i$ divisional beams having substantially an equal amount of power, whereby a total number of beams is determined with an equation, the equation being:

$$K = N - N' + \sum_{i=1}^{i=N'} n_i$$

where K is an integer.

2. The system according to claim 1, wherein the wavelength splitter assembly comprises:
   a device for splitting said initial beam into P unit beams, each of the P unit beams corresponding to one wavelength; and
   N means for grouping together some of the P unit beams into a plurality of groups of wavelengths to provide the N intermediate beams, wavelengths of one of the plurality of intermediate groups being disjoint from wavelengths of another of the plurality of intermediate groups.

3. The system according to claim 1, wherein said laser source is an ionized argon type, the P wavelengths are within a wavelength range of about 333.6 nm to about 363.8 nm, and the initial beam delivers power at 7 watts.

4. The system according to claim 3, wherein P is equal to 6, N is equal to 3, and N' is equal to 2.

5. The system according to claim 4, wherein $n_1$ is equal to 3 and $n_2$ is equal to 2.

6. The system according to claim 5, wherein the N intermediate beams comprise first, second, and third intermediate beams,
   the first intermediate beam comprising wavelengths within a wavelength range of about 333 nm to about 335 nm;
   the second intermediate beam comprising wavelengths of about 351.1 nm and about 351.4 nm; and
   the third intermediate beam comprising a wavelength of about 363.8 nm.

7. An equipment for selectively impacting a laser beam with a surface that is sensitive to the laser beam, said equipment comprising:
   a laser source, the laser source configured to an initial beam comprising P wavelengths, where P is an integer;
   a wavelength splitter assembly positioned to receive the initial beam from the laser source and configured to the initial beam into N intermediate beams, where N is an integer and N≦P, each intermediate beam comprising at least one wavelength;
   N' energy splitter assemblies, where N' is an integer and N'≦N, each energy splitter assembly positioned to receive one of the intermediate beams and configured to split an one of the intermediate beams into $n_i$ divisional beams, where $n_i$ is an integer, each of the $n_i$ divisional beams having substantially an equal amount of power, whereby a total number of beams are determined with an equation, the equation being:

$$K = N - N' + \sum_{i=1}^{i=N'} n_i$$

where K is an integer,
   K acousto-optical modulators, each modulator configured to receive an input beam and to provide modulated laser beams, wherein the input beam is one of the divisional beams or one of the intermediate beams, wherein each modulator is adapted to modulate beams having wavelength and power ranges substantially equal to wavelength and power ranges of the input beam that the modulator is configured to receive; and
   deflector means for deflecting each modulated laser beam so that each modulated laser beam scans a fraction of said surface.

8. A system for generating a plurality of laser beams that have substantially an equal amount of power, the system comprising:
   a laser source, the laser source configured to emit an initial beam comprising P wavelengths, where P is an integer;
   a wavelength splitter assembly positioned to receive the initial beam from the laser source, the wavelength splitter assembly configured to split the initial beam into P unit beams, each unit beam containing one of the P wavelengths;
   N means for grouping together some of the P unit beams into a plurality of groups of wavelengths to provide the N intermediate beams, where N is an integer, wavelengths of one of the plurality of intermediate groups being disjoint from wavelengths of another of the intermediate groups; and,
   N' energy splitter assemblies, where N' is an integer and N'≦N, each energy splitter assembly positioned to receive one of the intermediate beams and configured to split one of the intermediate beams into $n_i$ divisional beams, where $n_i$ is an integer, each of the $n_i$ divisional beams having substantially an equal amount of power, whereby a total number of beams is determined according to an equation, the equation being:

$$K = N - N' + \sum_{i=1}^{i=N'} n_i$$

where K is an integer.

9. The system according to claim 8, wherein said laser source is an ionized argon type, the P wavelengths are within a wavelength range of about 333.6 nm to about 363.8 nm, and the initial beam delivers power at about 7 watts.

10. The system according to claim 9, wherein P is equal to six, N is equal to three, and N' is equal to two.

11. The system according to claim 10, wherein $n_1$ is equal to 3 and $n_2$ is equal to 2.

12. The system according to claim 11, wherein the N intermediate beams comprise first, second, and third intermediate beams,
   the first intermediate beam comprising wavelengths within a wavelength range of about 333 nm to about 335 nm,
   the second intermediate beam comprising wavelengths of about 351.1 nm and about 351.4 nm, and
   the third intermediate beam comprising a wavelength of about 363.8 nm.

* * * * *